United States Patent [19]

Taumberger

[11] Patent Number: 4,893,901
[45] Date of Patent: Jan. 16, 1990

[54] ELECTRO-OPTICAL ASSEMBLY

[75] Inventor: Franz Taumberger, Munich, Fed. Rep. of Germany

[73] Assignee: Siemens Aktiengesellschaft, Berlin and Munich, Fed. Rep. of Germany

[21] Appl. No.: 246,798

[22] Filed: Sep. 20, 1988

[30] Foreign Application Priority Data

Sep. 25, 1987 [DE] Fed. Rep. of Germany ....... 3732391

[51] Int. Cl.$^4$ .............................................. G02B 27/00
[52] U.S. Cl. .................................... 350/321; 350/320; 350/253; 357/19; 357/84; 250/551
[58] Field of Search ............ 350/321, 320, 253, 96.11, 350/96.17, 96.15; 357/19, 31, 84; 250/551, 216

[56] References Cited

U.S. PATENT DOCUMENTS

| 3,908,185 | 9/1975 | Martin | 357/84 |
| 3,946,428 | 3/1976 | Anazawa et al. | 357/84 |
| 4,323,405 | 4/1982 | Uno et al. | 357/84 |
| 4,456,334 | 6/1984 | Henry et al. | 350/320 |
| 4,733,067 | 3/1988 | Oinoue et al. | 357/19 |
| 4,733,094 | 3/1988 | Carpentier et al. | 250/551 |

FOREIGN PATENT DOCUMENTS 555291 6/1986 Australia .

Primary Examiner—Rodney B. Bovernick
Assistant Examiner—Loha Ben
Attorney, Agent, or Firm—Hill, Van Santen, Steadman & Simpson

[57] ABSTRACT

A high precision integration of receiver modules for light waveguide transmission without risk of contamination of optical surfaces and without gluing and soldering includes joining a film circuit including a ceramic substrate with an integrated circuit and amplifier elements to the housing floor by a sheet shaped intermediate carrier. Joining of the film circuit to the intermediate carrier is carried out by one of the standard techniques, such as gluing soldering or alloying. The intermediate carrier is fastened to the housing floor by laser or resistance welding along edge strips of the intermediate carrier which are not covered by the film circuit.

12 Claims, 1 Drawing Sheet

ELECTRO-OPTICAL ASSEMBLY

BACKGROUND OF THE INVENTION

1. Field of the Invention

The present invention is related generally to an electrooptical assembly and more particularly to an assembly including optical components and at least one opto-electrical component on a substrate, the substrate being contained within a sealed housing.

2. Description of the Related Art

During the development of electro-optics, and particularly during the development of signal transmission through light waveguides, assemblies of optical components and electrical components such as, for example, film circuits are united. A problem exists during the manufacture of such assemblies in that the optical components have to be protected from even the slightest contamination to avoid signal loss, since the waveguides carry very low light amplitudes. Standard methods for fastening film circuits in a housing include either soldering with a fluxing agent or gluing with an adhesive which usually contains a solvent. These methods cannot be used in combination with optical components due to the risk of contamination.

In the European patent application No. EP-82-0118677, for example, is disclosed a method and apparatus for setting a light receiving end of a light conductor in the focus of a lens. The light conducting element is joined firmly to the lens carrying element with the assistance of a glue. Insofar as optically effective surfaces are exposed, there is a risk of contamination of the components by the epoxy resin glue or by the solvent of the adhesive.

An additional problem occurring during the manufacture of electro-optical assemblies is that an extremely precise assembly and alignment of the optical and opto-electrical components must be provided. This is due to the small dimensions of the light waveguides and of the light rays being transmitted. Particularly when mounting film circuits which contain electro-optical components, a problem arises that neither the standard mounting methods for optics nor the fastening methods for film circuit technology can be used.

SUMMARY OF THE INVENTION

An object of the present invention is to provide a high precision, positionally correct mounting for a film circuit containing an opto-electrical component in a metal housing containing optical components without the use of glue or solder.

This and other objects of the invention are achieved by an electro-optical assembly having a substrate secured in large area fashion to an intermediate carrier, the substrate being secured on its surface side facing away from a film circuit on the substrate. The intermediate carrier is composed of comparitively thin sheet of metal and has an area larger than that of the substrate. Edge strips of the carrier project beyond the substrate along at least two opposite sides and the edge strips are joined to the floor of the housing by spot welds. An expedient development of the electro-optical assembly of the invention include providing a metallic shield cap covering the substrate and an optical window in the metallic shield cap above opto-electrical components contained in the film circuit on the substrate. The shield cap is joined to the floor of the metallic housing with spot welds.

In one embodiment, the intermediate carrier has a coefficient of thermal expansion approximately corresponding to that of the substrate, while in another embodiment the intermediate carrier has a coefficient of thermal expansion lying between the coefficient of thermal expansion of the substrate and that of the housing floor. It is possible in some versions of the invention that the spot welds be joined together to form a welded seam.

A manufacturing method for the electro-optical assembly is also provided which includes the initial method steps of separately manufacturing the housing and the film circuit. Subsequently, the film circuit is secured to the intermediate carrier, after which the film circuit which has been mounted on the intermediate carrier is introduced into the housing and its position is adjusted on the housing floor. Subsequently, edge strips of the intermediate carrier are welded to the housing floor. Thereafter, a shield cap is positioned with its optical window over the film circuit and then is welded to the housing floor. Finally, the housing is completed by integrating further component parts in the housing and the housing parts are tightly closed.

The electro-optical assembly of the invention does not require subsequent cleaning such as to remove glue from optical surfaces after assembly. Furthermore, before the opto-electrical component is inserted into the film circuit, the film circuit is manufactured by one of the standard manufacturing methods so that any of a plurality of different film circuits may be used in the apparatus of the invention. As a result of the metallic intermediate carrier, good thermal contact is provided between the film circuit and the housing floor for improved heat elimination.

DESCRIPTION OF THE PREFERRED EMBODIMENTS

Figure 1:
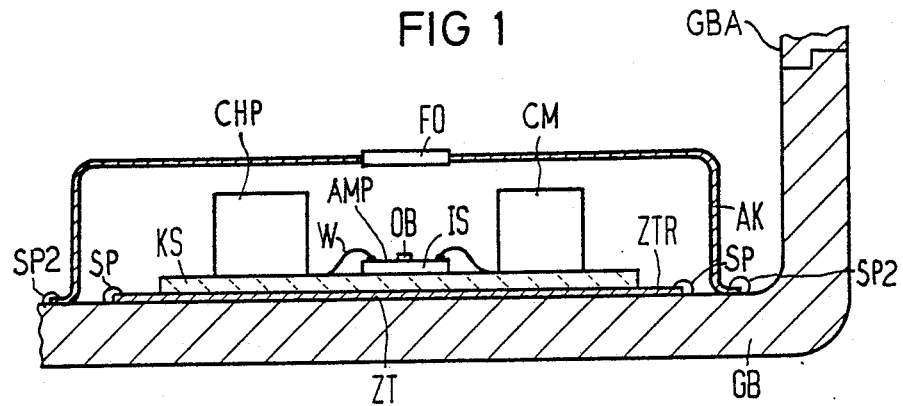
FIG. 1 is an elevational cross section through an electro-optical assembly according to the principles of the present invention.
Figure 2:
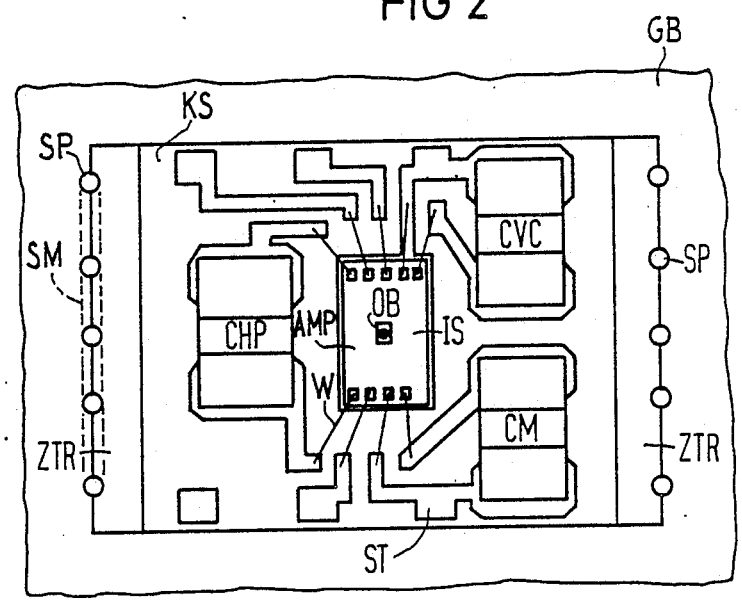
FIG. 2 is a plan view of the assembly of FIG. 1 with the shield cap removed.

In FIG. 1, a metallic housing floor GB is shown which is part of a metal housing GBA in which a receiver module for optical signal transmissions is integrated, the signal transmission occurring through light waveguides as well as through a mirror and an optical filter, as is known. An integrated circuit IS including an opto-electrical component OB is secured to a ceramic substrate KS to form part of a film circuit ST (FIG. 2). The ceramic substrate KS is secured in large area fashion to a comparitively thin metal sheet forming an intermediate carrier ZT, which in turn is mounted on the housing floor GB. The substrate KS is fastened on the intermediate carrier ZT by soldering, gluing, or alloying. The intermediate carrier ZT has large area, larger than that of the ceramic substrate KS so that edge strips ZTR which serve for fastening purposes to the housing floor GB project beyond the ceramic substrate KS along at least two opposite sides.

The integrated circuit IS also preferably contains an electrical amplifier arrangement AMP (not shown in detail) in addition to the opto-electrical component OB. For this reason, the entire film circuit ST on the substrate KS is preferably protected against electrical interference by a metallic shield cap AK. An optical window FO in the form of a light transmissive glass pane is provided in the shield cap AK above the opto-electrical component of the film circuit ST.

The intermediate carrier ZT of one embodiment is fabricated of Vacon 10 which has a coefficient of thermal expansion lying between the coefficient of thermal expansion of the ceramic substrate KS and of the housing floor GB. The joining or fastening of the intermediate carrier ZT and the shield cap AK to the housing floor GB is by spot welds SP and SP2, respectively, that are produced preferably by a laser welding method. Heat flux from the operation of the film circuit ST is carried through the ceramic substrate KS and through the intermediate carrier ZT to the housing floor GB well enough to provide good heat dissipation.

As can be seen in the plan view of FIG. 2, the electro-optical assembly of the invention has three capacitor chips CHP, CVC, and CM which are arranged on the substrate KS as part of the film circuit ST. The capacitor chips CHP, CVC and CM are in electrical communication with the integrated circuit IS via contact strips of the film circuit ST and bonding wires W. The intermediate carrier ZT projects from under the substrate KS and forms the edge strips ZTR at two opposite sides which are connected to the housing floor GB at their edge sides by spot welds SP. Instead of individual spot welds SP, the edge strips ZTR can also be held to the housing floor GB by a welded seam SM, as shown at the left side of FIG. 2 in broken outline.

The manufacturing method of the invention for the electro-optical assembly of FIGS. 1 and 2 includes a first method step of producing contact spots for the capacitors CHV, CVC and CM as well as a metallized carrier surface for the integrated circuit IS on the ceramic substrate KS. This is followed by equipping the film circuit with the individual components, fastening these components, for example, by thermal bonding, and fastening the ceramic substrate KS and film circuit on the intermediate carrier ZT. After this is accomplished, the film circuit together with the intermediate carrier ZT is adjusted in its proper position on the housing floor GB with a maximum error of about ±25 micrometers. The edge strips ZTR of the intermediate carrier ZT are then welded to the housing floor GB by laser welding to hold the circuit in place. The intermediate carrier ZT which carries the ceramic substrate KS is thereby pressed against the housing floor GB to ensure that heat flux from a ceramic substrate KS flows to the housing floor GB. Instead of laser welding, resistance welding methods can also be utilized for producing the spot welds SP. The welding methods can also be used to produce the welded seam SM. Finally, the present method provides for adjusting a shield cap AK with the optical window FO above the film circuit ST so that the optical window FO lies over the opto-electrical component OB of the integrated circuit IS. The shield cap AK is likewise joined to the housing floor GB by laser welding or resistance welding at SP2, for example. In view of the welding method used, the intermediate carrier ZT is nickel plated surface wide and partially gold plated and the shield cap AK is also nickel plated. After the shield cap AK is in place, any remaining components (not shown) are mounted in the housing and the other housing part GBA is secured to the housing floor GB.

Therefore, since the substrate KS is mounted by its circuit free side on the intermediate carrier ZT, there is a reduced risk of contamination of the optical and electronic circuits by the adhesive.

Although other modifications and changes may be suggested by those skilled in the art, it is the intention of the inventor to embody within the patent warranted hereon all changes and modifications as reasonably and properly come within the scope of his contribution to the art.

I claim:

1. An electro-optical assembly containing optical components and a film circuit arranged on a substrate, the film circuit having at least one opto-electrical component, the assembly being contained in a sealed housing having a metallic housing floor, comprising:
   an intermediate carrier secured in large area fashion to the substrate on the surface side of the substrate facing away from the film circuit, said intermediate carrier being composed of a comparatively thin sheet of metal and having an area larger than the substrate, said intermediate carrier including edge strips projecting beyond the substrate along at least two opposite sides, said edge strips being joined to the housing floor by welds.

2. An electro-optical assembly as claimed in claim 1, further comprising:
   a metallic shield cap covering the substrate, said metallic shield cap including an optical window disposed above the opto-electrical component on the film circuit of the substrate, said shield cap being joined to the housing floor by welds.

3. An electro-optical assembly as claimed in claim 1, wherein said intermediate carrier has a coefficient of thermal expansion approximately corresponding to the coefficient of thermal expansion of the substrate.

4. An electro-optical assembly as claimed in claim 1, wherein said intermediate carrier has a coefficient of thermal expansion lying between a coefficient of thermal expansion of the substrate and a coefficient of thermal expansion of the housing floor.

5. An electro-optical assembly as claimed in claim 1, wherein said welds are spot welds.

6. An electro-optical assembly as claimed in claim 1, wherein said welds are welded seams.

7. A method for manufacturing an electro-optical assembly, comprising the steps of:
   separately manufacturing a housing and a film circuit;
   securing said film circuit to an intermediate carrier;
   introducing said film circuit mounted on said intermediate carrier into said housing;
   adjusting said film circuit mounted on said intermediate carrier to a predetermined position in said housing on a housing floor;
   welding edge strips of said intermediate carrier to the housing floor in its adjusted position;
   adjusting an optical window of a shield cap to lie over said film circuit;
   welding said shield cap to said housing floor in its adjusted position; and
   integrating further component parts and housing parts and tightly closing said housing.

8. A method as claimed in claim 7, wherein said step of securing said film circuit to an intermediate carrier enables edge portions of said intermediate carrier to extend beyond opposite sides of said film circuit.

9. An electro-optical assembly, comprising:
   a substrate;

a film circuit on one side of said substrate, said film circuit including at least one opto-electrical component;

an intermediate carrier mounted on said substrate on a side opposite said film circuit, said intermediate carrier being of a thin metal sheet and having edge strips extending beyond edges of said substrate; and a housing having a metallic housing floor, said edge strips of said intermediate carrier being fastened to said metallic housing floor by welds.

10. An electro-optical assembly as claimed in claim 9, wherein said intermediate carrier has an area larger than said substrate.

11. An electro-optical assembly as claimed in claim 9, wherein said intermediate carrier has said edge strips extending beyond said substrate along two opposite sides.

12. An electro-optical assembly as claimed in claim 9, further comprising:

a shield cap mounted over said substrate, said shield cap having means for transmitting light disposed above said at least one opto-electrical component.

* * * * *